United States Patent
Reddy et al.

(10) Patent No.: US 9,589,799 B2
(45) Date of Patent: Mar. 7, 2017

(54) HIGH SELECTIVITY AND LOW STRESS CARBON HARDMASK BY PULSED LOW FREQUENCY RF POWER

(71) Applicant: Lam Research Corporation, Fremont, CA (US)

(72) Inventors: Sirish K. Reddy, Hillsboro, OR (US); Chunhai Ji, Portland, OR (US); Xinyi Chen, Tualatin, OR (US); Pramod Subramonium, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 101 days.

(21) Appl. No.: 14/248,046

(22) Filed: Apr. 8, 2014

(65) Prior Publication Data
US 2015/0093908 A1    Apr. 2, 2015

Related U.S. Application Data

(60) Provisional application No. 61/884,832, filed on Sep. 30, 2013.

(51) Int. Cl.
*H01L 21/02* (2006.01)
*H01L 21/033* (2006.01)
(Continued)

(52) U.S. Cl.
CPC ........ *H01L 21/0332* (2013.01); *C23C 16/505* (2013.01); *C23C 16/515* (2013.01); *H01L 21/02115* (2013.01); *H01L 21/02274* (2013.01)

(58) Field of Classification Search
CPC .......... H01L 21/02225; H01L 21/0226; H01L 21/70; H01L 21/702; H01L 21/71
See application file for complete search history.

(56) References Cited

U.S. PATENT DOCUMENTS

| | | | |
|---|---|---|---|
| 3,816,976 A | 6/1974 | Stork et al. | |
| 4,209,357 A | 6/1980 | Gorin et al. | |

(Continued)

FOREIGN PATENT DOCUMENTS

| | | |
|---|---|---|
| FR | 2853313 | 10/2004 |
| JP | 62019539 | 1/1987 |

(Continued)

OTHER PUBLICATIONS

US Office Action, dated May 15, 2015, issued in U.S. Appl. No. 14/270,001.

(Continued)

*Primary Examiner* — Cheung Lee
(74) *Attorney, Agent, or Firm* — Weaver Austin Villeneuve & Sampson LLP

(57) ABSTRACT

Methods of forming high etch selectivity, low stress ashable hard masks using plasma enhanced chemical vapor deposition are provided. In certain embodiments, the methods involve pulsing low frequency radio frequency power while keeping high frequency radio frequency power constant during deposition of the ashable hard mask using a dual radio frequency plasma source. According to various embodiments, the low frequency radio frequency power can be pulsed between non-zero levels or by switching the power on and off. The resulting deposited highly selective ashable hard mask may have decreased stress due to one or more factors including decreased ion and atom impinging on the ashable hard mask and lower levels of hydrogen trapped in the ashable hard mask.

17 Claims, 7 Drawing Sheets

(51) Int. Cl.
*C23C 16/505* (2006.01)
*C23C 16/515* (2006.01)

(56) References Cited

U.S. PATENT DOCUMENTS

| | | |
|---|---|---|
| 4,274,841 A | 6/1981 | Andresen et al. |
| 4,668,261 A | 5/1987 | Chatzipetros et al. |
| 4,673,589 A | 6/1987 | Standley |
| 4,863,493 A | 9/1989 | Kotani et al. |
| 4,863,760 A | 9/1989 | Schantz et al. |
| 4,975,144 A | 12/1990 | Yamazaki et al. |
| 5,022,959 A | 6/1991 | Itoh et al. |
| 5,222,549 A | 6/1993 | Ishii et al. |
| 5,231,057 A | 7/1993 | Doki et al. |
| 5,261,250 A | 11/1993 | Missimer |
| 5,378,316 A | 1/1995 | Franke et al. |
| 5,419,804 A | 5/1995 | Ojha et al. |
| 5,470,661 A | 11/1995 | Bailey et al. |
| 5,562,952 A | 10/1996 | Nakahigashi et al. |
| 5,670,066 A | 9/1997 | Barnes et al. |
| 5,792,269 A | 8/1998 | Deacon et al. |
| 5,900,288 A | 5/1999 | Kuhman et al. |
| 5,968,379 A | 10/1999 | Zhao et al. |
| 5,985,103 A | 11/1999 | Givens et al. |
| 6,006,797 A | 12/1999 | Bulow et al. |
| 6,030,591 A | 2/2000 | Tom et al. |
| 6,035,803 A | 3/2000 | Robles et al. |
| 6,041,734 A | 3/2000 | Raoux et al. |
| 6,066,209 A | 5/2000 | Sajoto et al. |
| 6,114,259 A | 9/2000 | Sukharev et al. |
| 6,150,719 A | 11/2000 | Saia et al. |
| 6,241,793 B1 | 6/2001 | Lee et al. |
| 6,286,321 B1 | 9/2001 | Glater |
| 6,319,299 B1 | 11/2001 | Shih et al. |
| 6,331,480 B1 | 12/2001 | Tsai et al. |
| 6,367,413 B1 | 4/2002 | Sill et al. |
| 6,387,819 B1 | 5/2002 | Yu |
| 6,422,918 B1 | 7/2002 | Avanzino et al. |
| 6,458,516 B1 | 10/2002 | Ye et al. |
| 6,465,051 B1 | 10/2002 | Sahin et al. |
| 6,478,924 B1 | 11/2002 | Shamouilian et al. |
| 6,541,397 B1 | 4/2003 | Bencher |
| 6,573,030 B1 | 6/2003 | Fairbairn et al. |
| 6,613,434 B1 | 9/2003 | Drevillon et al. |
| 6,617,553 B2 | 9/2003 | Ho et al. |
| 6,635,185 B2 | 10/2003 | Demmin |
| 6,777,349 B2 | 8/2004 | Fu et al. |
| 6,787,452 B2 | 9/2004 | Sudijono et al. |
| 6,787,819 B2 | 9/2004 | Rhodes et al. |
| 6,884,733 B1 | 4/2005 | Dakshina-Murthy |
| 6,967,072 B2 | 11/2005 | Latchford et al. |
| 7,064,078 B2 | 6/2006 | Liu et al. |
| 7,202,176 B1 | 4/2007 | Goto et al. |
| 7,205,228 B2 | 4/2007 | Padhi et al. |
| 7,220,982 B2 | 5/2007 | Campbell |
| 7,223,526 B2 | 5/2007 | Fairbairn et al. |
| 7,235,478 B2 | 6/2007 | Geng et al. |
| 7,271,106 B2 | 9/2007 | Abatchev et al. |
| 7,288,484 B1 | 10/2007 | Goto et al. |
| 7,314,506 B2 | 1/2008 | Vininski et al. |
| 7,323,401 B2 | 1/2008 | Ramaswamy et al. |
| 7,381,644 B1 | 6/2008 | Subramonium et al. |
| 7,399,712 B1 | 7/2008 | Graff |
| 7,495,984 B2 | 2/2009 | Kim et al. |
| 7,576,009 B2 | 8/2009 | Lee et al. |
| 7,803,715 B1 | 9/2010 | Haimson et al. |
| 7,820,556 B2 | 10/2010 | Hsu et al. |
| 7,915,166 B1 | 3/2011 | Yu et al. |
| 7,955,990 B2 | 6/2011 | Henri et al. |
| 7,981,777 B1 | 7/2011 | Subramonium et al. |
| 7,981,810 B1 | 7/2011 | Subramonium et al. |
| 8,110,493 B1 | 2/2012 | Subramonium et al. |
| 8,114,782 B2 | 2/2012 | Graff |
| 8,129,281 B1 | 3/2012 | Cheung et al. |
| 8,227,352 B2 | 7/2012 | Yu et al. |
| 8,309,473 B2 | 11/2012 | Hsu et al. |
| 8,435,608 B1 | 5/2013 | Subramonium et al. |
| 8,563,414 B1 | 10/2013 | Fox et al. |
| 8,569,179 B2 | 10/2013 | Graff |
| 8,664,124 B2 | 3/2014 | Graff |
| 8,669,181 B1 | 3/2014 | Yu et al. |
| 8,962,101 B2 | 2/2015 | Subramonium et al. |
| 9,240,320 B1 | 1/2016 | Subramonium et al. |
| 9,304,396 B2 | 4/2016 | Shamma et al. |
| 9,320,387 B2 | 4/2016 | Reddy et al. |
| 2001/0021491 A1 | 9/2001 | Chen et al. |
| 2002/0182848 A1 | 12/2002 | Joseph et al. |
| 2002/0185151 A1 | 12/2002 | Qingyuan et al. |
| 2003/0044532 A1 | 3/2003 | Lee et al. |
| 2003/0106647 A1 | 6/2003 | Koshiishi et al. |
| 2003/0124859 A1* | 7/2003 | Cheung ............... C23C 16/401 438/692 |
| 2004/0000534 A1 | 1/2004 | Lipinski |
| 2004/0016972 A1 | 1/2004 | Singh et al. |
| 2004/0018750 A1 | 1/2004 | Sophie et al. |
| 2004/0023502 A1 | 2/2004 | Tzou et al. |
| 2004/0058517 A1 | 3/2004 | Nallan et al. |
| 2004/0140506 A1 | 7/2004 | Singh et al. |
| 2004/0180551 A1 | 9/2004 | Biles et al. |
| 2004/0224504 A1 | 11/2004 | Gadgil |
| 2004/0266195 A1 | 12/2004 | Dokumaci et al. |
| 2005/0042889 A1 | 2/2005 | Lee et al. |
| 2005/0054202 A1 | 3/2005 | Pan et al. |
| 2005/0098119 A1 | 5/2005 | Burger et al. |
| 2005/0112506 A1 | 5/2005 | Czech et al. |
| 2005/0129935 A1 | 6/2005 | Kunitake et al. |
| 2005/0130404 A1 | 6/2005 | Moghadam et al. |
| 2005/0167394 A1 | 8/2005 | Liu et al. |
| 2005/0202683 A1 | 9/2005 | Wang et al. |
| 2005/0260411 A1 | 11/2005 | Ravi |
| 2005/0287771 A1 | 12/2005 | Seamons et al. |
| 2006/0019486 A1 | 1/2006 | Yu et al. |
| 2006/0091559 A1 | 5/2006 | Nguyen et al. |
| 2006/0154086 A1 | 7/2006 | Fuller et al. |
| 2006/0154477 A1 | 7/2006 | Geng et al. |
| 2006/0197881 A1 | 9/2006 | Kang et al. |
| 2006/0205223 A1 | 9/2006 | Smayling |
| 2006/0231524 A1 | 10/2006 | Liu et al. |
| 2006/0246373 A1 | 11/2006 | Wang |
| 2007/0032054 A1 | 2/2007 | Ramaswamy et al. |
| 2007/0048674 A1 | 3/2007 | Wells |
| 2007/0054500 A1 | 3/2007 | Bencher |
| 2007/0059913 A1 | 3/2007 | King et al. |
| 2007/0072112 A1 | 3/2007 | Prokopowicz et al. |
| 2007/0077780 A1 | 4/2007 | Wang et al. |
| 2007/0105303 A1 | 5/2007 | Busch et al. |
| 2007/0125762 A1 | 6/2007 | Cui et al. |
| 2007/0128538 A1 | 6/2007 | Fairbairn et al. |
| 2007/0140029 A1 | 6/2007 | Kim et al. |
| 2007/0166546 A1 | 7/2007 | Ichikawa et al. |
| 2007/0166979 A1 | 7/2007 | Wang et al. |
| 2007/0202640 A1 | 8/2007 | Al-Bayati et al. |
| 2007/0247073 A1 | 10/2007 | Paterson et al. |
| 2007/0249172 A1 | 10/2007 | Huang et al. |
| 2008/0073636 A1 | 3/2008 | Kim |
| 2008/0083916 A1 | 4/2008 | Kim |
| 2008/0128907 A1 | 6/2008 | Yang et al. |
| 2008/0200003 A1 | 8/2008 | Hong et al. |
| 2008/0242912 A1 | 10/2008 | Letessier et al. |
| 2008/0254639 A1 | 10/2008 | Graff |
| 2008/0254641 A1 | 10/2008 | Kobayashi et al. |
| 2008/0264803 A1 | 10/2008 | Agrawal |
| 2009/0176174 A1 | 7/2009 | Chen et al. |
| 2009/0182180 A1 | 7/2009 | Huang et al. |
| 2009/0305516 A1 | 12/2009 | Hsu et al. |
| 2010/0151691 A1 | 6/2010 | Henri et al. |
| 2010/0297853 A1 | 11/2010 | Hsu et al. |
| 2011/0236594 A1 | 9/2011 | Haverkamp et al. |
| 2011/0236600 A1 | 9/2011 | Fox et al. |
| 2011/0244142 A1 | 10/2011 | Cheng et al. |
| 2012/0149207 A1 | 6/2012 | Graff |
| 2012/0196446 A1 | 8/2012 | Graff |
| 2013/0109188 A1* | 5/2013 | Kim ............... H01L 21/31122 438/710 |

(56) References Cited

U.S. PATENT DOCUMENTS

| | | | |
|---|---|---|---|
| 2013/0216956 A1 | 8/2013 | Kishioka et al. |
| 2014/0057454 A1 | 2/2014 | Subramonium et al. |
| 2014/0199628 A1 | 7/2014 | Edelstein et al. |
| 2014/0239462 A1 | 8/2014 | Shamma et al. |
| 2014/0273469 A1 | 9/2014 | Wahl et al. |
| 2014/0273473 A1 | 9/2014 | Schmid et al. |
| 2015/0093915 A1 | 4/2015 | Reddy et al. |

FOREIGN PATENT DOCUMENTS

| | | |
|---|---|---|
| JP | 08-152262 | 6/1996 |
| SU | 382671 | 5/1973 |
| WO | WO 2005/048367 | 5/2005 |

OTHER PUBLICATIONS

US Final Office Action, dated Aug. 4, 2014, issued in U.S. Appl. No. 13/974,808.
US Notice of Allowance, dated Oct. 23, 2014, issued in U.S. Appl. No. 13/974,808.
Taiwan Office Action, dated May 8, 2014, issued in TW Application No. 098142631.
U.S. Appl. No. 14/185,757, filed Feb. 20, 2014, entitled PECVD Films for EUV Lithography.
U.S. Appl. No. 13/160,399, filed Jun. 14, 2011, entitled "Methods of Depositing Highly Selective Transparent Ashable Hardmask Films"
U.S. Appl. No. 11/612,382, filed Dec. 18, 2006, entitled "Methods of Improving Ashable Hardmask Adhesion to Metal layers".
U.S. Appl. No. 11/849,208, filed Aug. 31, 2007, entitled "Methods and Apparatus for Plasma-Based Deposition".
U.S. Appl. No. 13/856,364, filed Apr. 3, 2013, entitled "Methods of Depositing Smooth and Conformal Ashable Hard Mask Films".
US Notice of Allowance, dated Oct. 4, 2006, issued in U.S. Appl. No. 11/318,269.
US Office Action, dated Dec. 14, 2006, issued in U.S. Appl. No. 11/318,269.
US Notice of Allowance, dated May 7, 2007, issued in U.S. Appl. No. 11/318,269.
US Office Action, dated Aug. 27, 2007, issued in U.S. Appl. No. 11/318,269.
US Notice of Allowance, dated Jan. 7, 2008, issued in U.S. Appl. No. 11/318,269.
US Office Action, dated Nov. 22, 2010, issued in U.S. Appl. No. 12/048,967.
US Office Action, dated Apr. 18, 2011, issued in U.S. Appl. No. 12/048,967.
US Notice of Allowance, dated Oct. 7, 2011, issued in U.S. Appl. No. 12/048,967.
US Office Action dated, Dec. 27, 2007, issued in U.S. Appl. No. 11/449,983.
US Final Office Action, dated Jul. 9, 2008, issued in U.S. Appl. No. 11/449,983.
US Office Action, dated Jan. 5, 2009, issued in U.S. Appl. No. 11/449,983.
US Final Office Action, dated Sep. 15, 2009, issued in U.S. Appl. No. 11/449,983.
US Office Action, dated Jun. 21, 2010, issued in U.S. Appl. No. 11/449,983.
US Final Office Action, dated Dec. 30, 2010, issued in U.S. Appl. No. 11/449,983.
US Notice of Allowance, dated Mar. 16, 2011, issued in U.S. Appl. No. 11/449,983.
US Office Action, dated Jun. 1, 2007, issued in U.S. Appl. No. 11/612,382.
US Office Action, dated Oct. 9, 2007, issued in U.S. Appl. No. 11/612,382.
US Final Office Action, dated May 13, 2008, issued in U.S. Appl. No. 11/612,382.
US Office Action, dated Aug. 19, 2008, issued in U.S. Appl. No. 11/612,382.
US Final Office Action, dated Feb. 24, 2009, issued in U.S. Appl. No. 11/612,382.
US Final Office Action, dated May 12, 2009, issued in U.S. Appl. No. 11/612,382.
US Final Office Action, dated Dec. 9, 2009, issued in U.S. Appl. No. 11/612,382.
US Office Action, dated Mar. 26, 2010, issued in U.S. Appl. No. 11/612,382.
US Office Action dated Nov. 20, 2009, issued in U.S. Appl. No. 11/710,652.
US Final Office Action dated Apr. 15, 2010, issued in U.S. Appl. No. 11/710,652.
US Office Action dated Aug. 5, 2010, issued in U.S. Appl. No. 11/710,652.
US Notice of Allowance dated Nov. 24, 2010, issued in U.S. Appl. No. 11/710,652.
US Office Action dated Jul. 9, 2013, issued in U.S. Appl. No. 13/032,392.
US Notice of Allowance dated Oct. 25, 2013, issued in U.S. Appl. No. 13/032,392.
US Office Action, dated Jan. 5, 2009, issued in U.S. Appl. No. 11/710,377.
US Office Action, dated Aug. 19, 2009, issued in U.S. Appl. No. 11/710,377.
US Office Action, dated Mar. 31, 2010, issued in U.S. Appl. No. 11/710,377.
US Notice of Allowance, dated Mar. 22, 2011, issued in U.S. Appl. No. 11/710,377.
US Office Action, dated Sep. 3, 2010, issued in U.S. Appl. No. 11/849,208.
US Final Office Action, dated Apr. 12, 2011, issued in U.S. Appl. No. 11/849,208.
US Final Office Action, dated Sep. 14, 2012, issued in U.S. Appl. No. 11/849,208.
US Final Office Action, dated Apr. 24, 2013, issued in U.S. Appl. No. 11/849,208.
US Office Action, dated Feb. 28, 2014, issued in U.S. Appl. No. 13/974,808.
US Office Action, dated Oct. 19, 2011, issued in U.S. Appl. No. 12/163,670.
US Office Action, dated Feb. 14, 2012, issued in U.S. Appl. No. 12/163,670.
US Office Action, dated Jul. 6, 2012, issued in U.S. Appl. No. 12/163,670.
US Final Office Action dated Oct. 18, 2012, issued in U.S. Appl. No. 12/163,670.
US Notice of Allowance dated Jan. 3, 2013, issued in U.S. Appl. No. 12/163,670.
US Notice of Allowance, dated Nov. 2, 2010, issued in U.S. Appl. No. 12/334,220.
US Supplemental Notice of Allowance, dated Feb. 8, 2011, issued in U.S. Appl. No. 12/334,220.
US Office Action, dated Aug. 19, 2009, issued in U.S. Appl. No. 12/133,223.
US Final Office Action, dated Dec. 21, 2009, issued in U.S. Appl. No. 12/133,223.
US Notice of Allowance, dated Mar. 2, 2010, issued in U.S. Appl. No. 12/133,223.
US Office Action, dated Nov. 9, 2011, issued in U.S. Appl. No. 12/786,842.
US Final Office Action, dated Apr. 19, 2012, issued in U.S. Appl. No. 12/786,842.
US Notice of Allowance, dated Jul. 20, 2012, issued in U.S. Appl. No. 12/786,842.
US Office Action, dated Aug. 10, 2012, issued in U.S. Appl. No. 12/766,721.
US Final Office Action, dated Mar. 14, 2013, issued in U.S. Appl. No. 12/766,721.
US Notice of Allowance, dated Jun. 28, 2013, issued in U.S. Appl. No. 12/766,721.

(56) References Cited

OTHER PUBLICATIONS

US Office Action, dated Jun. 1, 2007, issued in U.S. Appl. No. 11/263,148.
US Final Office Action, dated Oct. 24, 2007, issued in U.S. Appl. No. 11/263,148.
US Notice of Allowance, dated Mar. 18, 2008, issued in U.S. Appl. No. 11/263,148.
US Office Action, dated May 2, 2011, issued in U.S. Appl. No. 11/263,148.
US Notice of Allowance, dated Oct. 13, 2011, issued in U.S. Appl. No. 11/263,148.
US Office Action, dated Feb. 15, 2013, issued in U.S. Appl. No. 13/371,184.
US Notice of Allowance, dated Jul. 1, 2013, issued in U.S. Appl. No. 13/371,184.
US Office Action, dated Oct. 9, 2013, issued in U.S. Appl. No. 13/372,363.
US Notice of Allowance, dated Dec. 30, 2013, issued in U.S. Appl. No. 13/372,363.
Korean Office Action, dated Jun. 1, 2010, issued in Application No. 2009/0048358.
Callegari et al. (1993) "Optical properties of hydrogenated amorphous-carbon film for attenuated phase-shift mask applications," J.Vac. Sci. Technol. B 11(6):2697-2699.
Grill, A. (1999) "Diamond-like carbon: state of the art," Diamond and Related Materials 8,pp. 428-434.
Grill, A. (1999) "Plasma-deposited diamondlike carbon and related materials," IBM Journal of Research and Development, vol. 43, ½, http://research.ibm.com/journal/rd/431/grill.html.,14 pp.
Grill, et al. (1990) "Diamondlike carbon films by rf plasma-assisted chemical vapor deposition from acetylene," IBM J. Res. Develop., 34(6):849-857.
Holmes et al. (1987) "Trimethylsilylacetylene", Organic Syntheses, Coll. vol. 8, p. 606; vol. 65, p. 61.
Ikeda et al. (1992) "Top-PECVD": A New Conformal Plasma Enhanced CVD Technology using TEOS, Ozone and Pulse-modulated RF Plasma, IEEE, pp. 11.2.1-11.2.4.
Jacobsohn et al. (1998) "Hydrogenated Carbon-Nitrogen Films Obtained by PECVD Using Acetylyne and Nitrogen As Precursor Gases," Mat. Res. Soc. Symp. Proc., 498: 283-288.
Kragler et al. (1995) "Scanning tunneling microscopy based lithography employing amorphous hydrogenated carbon as a high resolution resist mask," Appl. Phys. Lett. 67(8):1163-1165.
Kreupl, Franz et al. (2008) "Carbon-Based Resistive Memory," presented at IEDM, submitted Jun. 26, 2008; accepted Aug. 4, 2008, 4 pages.
Lemaire, P.J., Walker, K.L., Kranz, K.S., Huff, R.G. and DiMarcello, F.V. "Diffusion of Hydrogen Through Hermetic Carbon Films on Silica Fibers," AT&T Bell Laboratories, 600 Mountain Avenue, Murray Hill, NJ 07974. Mat. Res. Soc. Symp. Proc., 172:85-96 © 1990 Materials Research Society.
Muhl et al. (1999) "A Review of the Preparation of Carbon Nitride Films," Diamond and Related Materials, 8: 1809-1830.
Ong, Soon-Eng et al. (2007) "Temperature effect on bonding structures of amorphous carbon containing more than 30at.% silicon," Diamond & Related Materials, 16:1823-1827.
Van de Ven et al. (1990) "Advantages of Dual Frequency PECVD for Deposition of ILD and Passivation Films," VLSI Multilevel Interconnection Conference Proceedings, Seventh International IEEE, 194-201.
Voronkin et al. (1994) "Structure and mechanical properties of a-C:H films deposited onto polymer substrates: Diamond and Related Materials," 4:5-9.
U.S. Appl. No. 15/053,987, filed Feb. 25, 2016, entitled "PECVD Films for EUV Lithography.".
US Office Action, dated Aug. 6, 2015, issued in U.S. Appl. No. 14/185,757.
US Notice of Allowance, dated Nov. 25, 2015, issued in U.S. Appl. No. 14/185,757.
US Final Office Action, dated Oct. 9, 2015, issued in U.S. Appl. No. 14/270,001.
US Notice of Allowance, dated Dec. 23, 2015, issued in U.S. Appl. No. 14/270,001.
US Notice of Allowance dated Sep. 22, 2015, issued in U.S. Appl. No. 13/856,364.
Korean Office Action, dated Sep. 15, 2015, issued in KR Application No. 10-2009-0123999.
Singapore Search Report and Written Opinion dated Dec. 15, 2015 issued in SG 201300974-1.
FABTECH news release: "New Product: Ashable hard mask process from Novellus targets high aspect ratio etch," (Jun. 28, 2007), 2 pages.
Matheson brochure: "PICO-TRAP™ AHM: Ultra-Purification System for PECVD of Amorphous Carbon Films," (Apr. 2010), *Matheson*, 2pp.
Subramonium et al., "Low Temperature Ashable Hardmask (AHM™) Films for sub-45nm Patterning," citation information unavailable, no date available, 3pp.

\* cited by examiner

US 9,589,799 B2

HIGH SELECTIVITY AND LOW STRESS CARBON HARDMASK BY PULSED LOW FREQUENCY RF POWER

CROSS-REFERENCE TO RELATED APPLICATION

This application claims benefit of U.S. Provisional Patent Application No. 61/884,832, filed on Sep. 30, 2013, and titled "HIGH SELECTIVITY AND LOW STRESS CARBON HARDMASK BY PULSED LOW FREQUENCY RF POWER," which is herein incorporated by reference in its entirety and for all purposes.

BACKGROUND

Amorphous carbon films may be used as hard masks and etch stop layers in semiconductor processing, including in memory and logic device fabrication. These films are also known as ashable hard masks (AHMs) because they may be removed by an ashing technique. As aspect ratios in lithography increase, AHMs require higher etch selectivity. Current methods of forming highly selective AHMs using plasma enhanced chemical vapor deposition (PECVD) processes result in AHMs with high stress, limiting the AHMs' usefulness as hard masks. Accordingly, it is desirable to produce AHMs having high etch selectivity, but low stress.

SUMMARY

Provided are novel methods of depositing ashable hard masks (AHMs) by plasma enhanced chemical vapor deposition (PECVD) that decrease stress levels and increase etch selectivity for use in semiconductor processing, including in memory and logic device fabrication. In various embodiments, the methods can involve exposing a layer on a semiconductor substrate to a process gas including a hydrocarbon precursor, and generating plasma using a dual radio frequency (RF) source by pulsing a low frequency (LF) RF power while maintaining a constant high frequency (HF) RF power during deposition by PECVD. Examples of layers on which an AHM may be deposited include dielectric layers such as oxides and nitrides, and polysilicon layers. According to various embodiments, pulsing the LF power can involve modulating between non-zero levels or switching the LF power on and off. In some embodiments, the LF power is pulsed at a frequency between about 2 Hz and about 200 Hz. Deposition may be performed at high or low process temperatures.

In one aspect, a method of depositing highly selective, low stress AHMs is provided. According to various embodiments, LF RF power is pulsed while HF RF power is constant during deposition by introduction of a precursor gas. In some embodiments, the deposited AHM has a hydrogen content of between about 10% and about 25%, for example about 18%. In certain embodiments, the deposited AHM has an etch selectivity between about 3.6 and about 4.4.

Another aspect relates to a method of forming an amorphous carbon layer on a semiconductor substrate. In various embodiments, the amorphous carbon layer is deposited using a dual RF plasma source while LF RF power is pulsed and HF power is constant. In some embodiments, the LF power is pulsed between non-zero levels. In some embodiments, the LF is pulsed by switching LF power on and off. In certain embodiments, the LF power is pulsed at a frequency between about 2 Hz and about 10 Hz. Deposition may be performed at high or low process temperatures.

Another aspect relates to an apparatus configured to process a semiconductor substrate. According to various embodiments, the apparatus includes a deposition chamber including a showerhead, a substrate support and one or more gas inlets; a dual RF plasma generator with a HF component and a LF component configured to apply RF power to the deposition chamber; and a controller. The controller is configured to control the operations in the apparatus and includes machine readable instructions for: flowing a process gas including a hydrocarbon precursor gas to the deposition chamber, applying dual frequency RF power to the deposition chamber to ignite plasma, and pulsing LF power while holding HF power constant.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor processing, masking methods are used to pattern and etch substrates. As substrate aspect ratios increase, the demand for highly selective hard masks increases. Masks that have high etch selectivity and yet are easy to remove without damage to the substrate are important to processing substrates. Ashable hard masks (AHMs) can be used as masks in etch stop layers or during selective etching, or where a photoresist may not be thick enough to mask the underlying layer. AHMs may also be used on glass substrates for display and other technologies.

AHMs have a chemical composition that allows them to be removed by a technique referred to as "ashing," "plasma ashing," or "dry stripping" once they have served their purpose. One example of an AHM is an amorphous carbon layer or film. An AHM is generally composed of carbon and hydrogen with, optionally, a trace amount of one or more dopants (e.g., nitrogen, fluorine, boron, and silicon). The bonding structure of an AHM can vary from $sp^2$ (graphite-like) or $sp^3$ (diamond-like), or a combination of both, depending on the deposition conditions.

Figure 1:
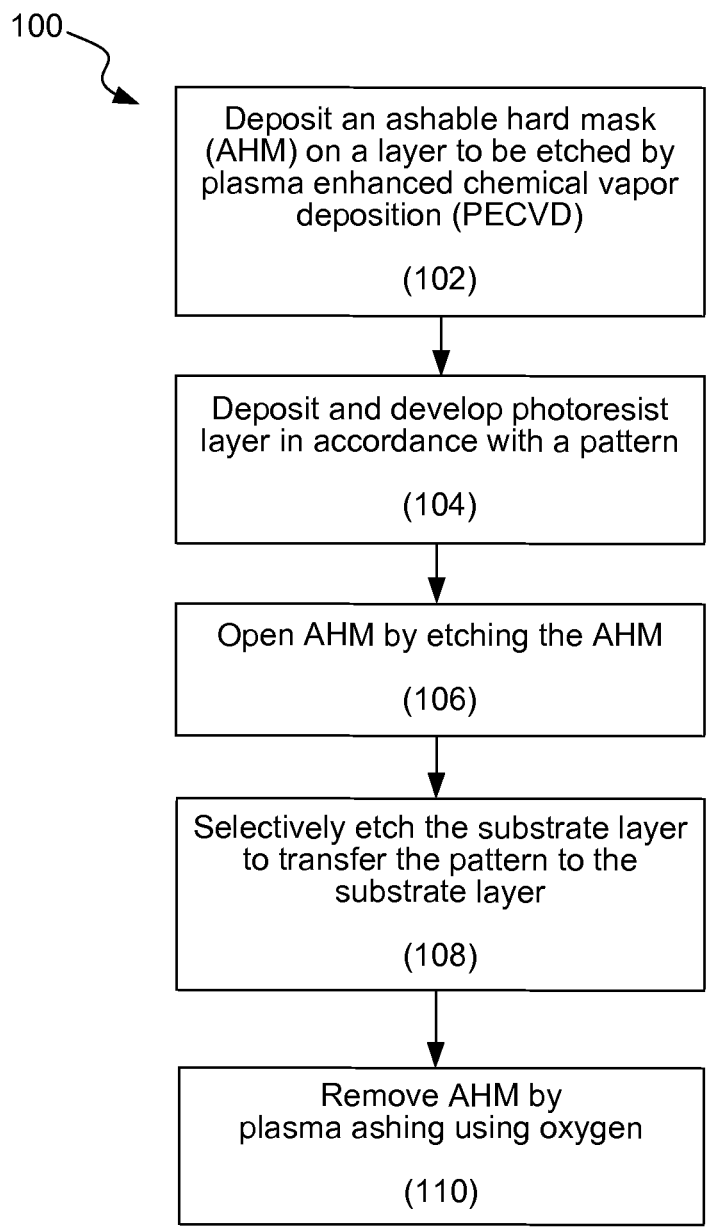
FIG. 1 is a process flow diagram showing relevant operations of methods of using ashable hard masks in etching operations according to various embodiments.

FIG. 1 is a process flow diagram showing relevant operations of methods of using an AHM as a hard mask in etching operations. Prior to AHM deposition, a substrate having a layer to be etched can be provided in a deposition chamber. While the description below refers chiefly to semiconductor substrates, the methods may also be applied to layers on other types of substrates including glass substrates. Examples of materials that may be masked with the AHM include dielectric materials such as oxides (e.g., $SiO_2$) and nitrides (e.g., SiN and TiN), polysilicon (Poly-Si), and metals such as aluminum (Al), copper (Cu), and tungsten (W). In certain embodiments, the AHMs described herein are used to pattern oxides, nitrides, or polysilicon layers.

In operation 102, an ashable hard mask is deposited on the layer to be etched by plasma enhanced chemical vapor deposition (PECVD). PECVD processes involve generating plasma in the deposition chamber. As described further below with reference to FIG. 2, a dual radio frequency (RF) plasma sources that include a high frequency (HF) power and a low frequency (LF) power may be used. In some processes, one or more AHM layers are deposited.

In operation 104, a photoresist layer is deposited, exposed, and developed in accordance with the desired etch pattern. In some implementations, an anti-reflective layer (ARL) may be deposited on the AHM prior to photoresist deposition.

In operation 106, the AHM is opened by etching the exposed portions of the AHM. Opening the AHM may be performed by a fluorine-rich dry etch.

Next, in operation 108, the substrate layer is selectively etched to transfer the pattern to the substrate layer. The selective etch may be performed such that the substrate layer is etch without substantially diminishing the AHM walls. Examples of etches can include radical and/or ionic-based etches. Examples of etch chemistries can include halogen-based etch chemistries such as fluorine-containing and chlorine-containing etch chemistries. For example, capacitively-coupled plasmas generated from fluorocarbon-containing process gases may be used to selectively etch oxide layers. Specific examples of process gases include $C_xF_y$-containing process gases, optionally with oxygen ($O_2$) and an inert gas, such as $C_4H_8/CH_2F_2/O_2/Ar$.

Lastly, in operation 110, a technique referred to as ashing, plasma ashing, or dry stripping is used to remove the AHM. Ashing may be performed by an oxygen-rich dry etch. Often, oxygen is introduced in a chamber under vacuum and RF power creates oxygen radicals in plasma to react with the AHM and oxidize it to water ($H_2O$), carbon monoxide (CO), and carbon dioxide ($CO_2$). Optionally, any remaining AHM residue may also be removed by wet or dry etching processes after ashing. The result is the desired patterned substrate layer.

High aspect ratio patterning uses AHMs having high etch selectivity. Etch selectivity can be determined by comparing the etch rate of the AHM layer to an underlying layer. The etch selectivity can also be approximated by determining the modulus, or rigidity, of the AHM layer. A more rigid, or higher modulus, AHM is able to withstand higher etch rates in an etch process involving more ion bombardment. Therefore, AHMs with higher modulus have higher selectivity and lower etching rate and can be used more efficiently and effectively for processing high aspect ratio semiconductor processes. The desired etch selectivity and modulus of the AHM may depend on the etching process and the composition of the underlying layers, but the correlation between etch selectivity and modulus (e.g., higher modulus for higher etch selectivity) remains the same regardless of the etching process or composition of the underlying layers. The modulus-selectivity correlation as described here applies to all types of underlying layers, including polysilicon layers, oxide layers, and nitride layers.

To date, known, highly selective AHMs have very high stress levels. Current methods to form AHMs use continuous wave RF power plasma in a PECVD process. Using continuous wave RF power results in continuous ion bombardment, which increases film density, thereby increasing etch selectivity by creating more $sp^3$ bonds between atoms. However, continuous ion bombardment may also incorporates excessive unbound hydrogen atoms in the film and causes high ion bombardment of heavy atomic weight ions. This may increase the stress of the deposited AHM, which limits AHM applications because high stress AHMs are more likely to collapse or compress. Increased stress levels also make laser alignment more difficult.

According to various embodiments, provided herein are methods of forming AHMs that have high selectivity and low stress. These methods yield AHMs with improved selectivity at a given stress level, or a decreased stress level at a given selectivity, thus improving the AHM performance in semiconductor processing.

Figure 2:
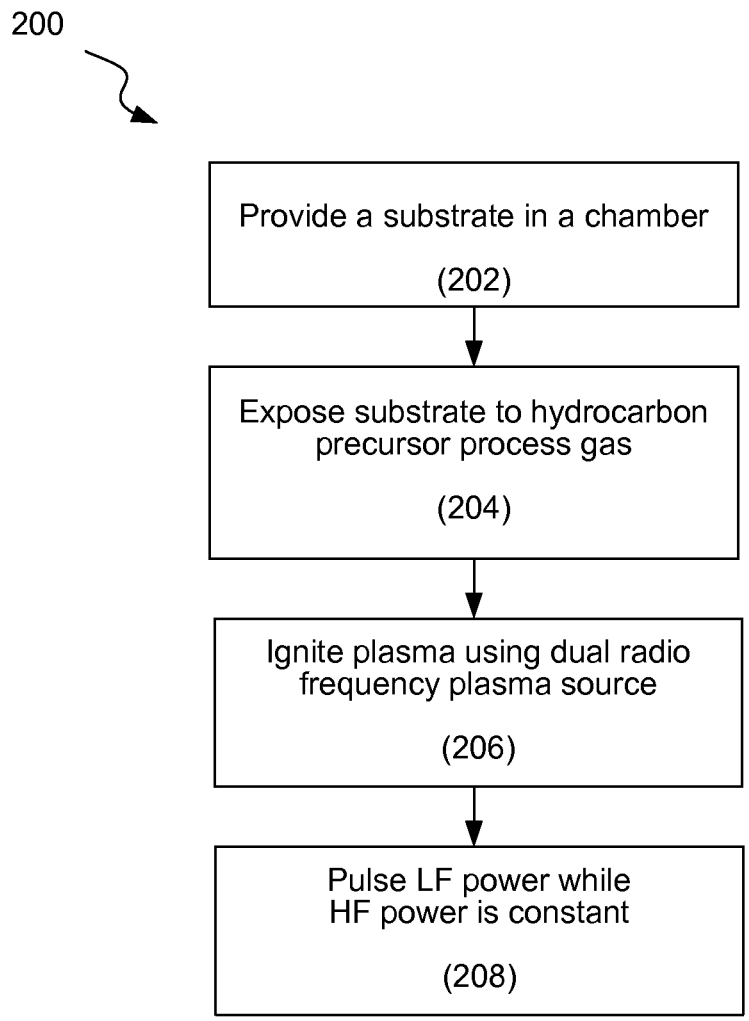
FIG. 2 is a process flow diagram showing relevant operations of methods of forming ashable hard masks by modulating dual radio frequency plasma generators according to various embodiments.

FIG. 2 shows a process flow diagram showing relevant operations of methods of forming AHMs by modulating dual RF plasma power according to various embodiments. The method 200 begins by providing a substrate in a chamber in operation 202. Examples of substrates and substrate layers are described above with reference to FIG. 1. In FIG. 1, an integration method using an AHM as a hard mask is described. In some other embodiments, the AHMs described herein may also be used as etch stop layers in addition to or instead of as hard masks. The substrate is then exposed to a process gas including a hydrocarbon precursor in operation 204. In some embodiments, the hydrocarbon precursor may be one defined by the formula $C_xH_y$, wherein X is an integer between 2 and 10, and Y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$).

In some embodiments, two or more hydrocarbon precursors may be introduced. In addition to hydrocarbon precursors, a carrier gas may be used to dilute the precursor gas flow. The carrier gas may be any suitable carrier gas, including helium (He), argon (Ar), nitrogen ($N_2$), hydrogen ($H_2$), or a combination of any of these.

Total pressure in the deposition chamber may range from between about 1 and about 20 Torr. In some embodiments, pressure is between about 5 Torr and about 10 Torr. In some embodiments, the hydrocarbon precursor is introduced at a low partial pressure, e.g., between about 0.01 Torr and about 4 Torr, as discussed in U.S. Pat. Nos. 7,981,777 and 7,981,810, which are incorporated by reference herein. In certain embodiments, the partial pressure is at or below about 0.2 Torr.

Precursor gas flow rates depend on the particular deposition chamber and substrate. Examples of flow rates used for four 300 mm substrates are between about 200 sccm and about 4,000 sccm of acetylene, between about 1,000 sccm and about 20,000 sccm of hydrogen, and between about 1000 sccm and about 20,000 sccm of helium.

The flow rates and RF powers disclosed herein are for a four-station tool configured for 300 mm wafers. Power levels and flow rates generally scale linearly with the number of stations and substrate area. The flow rates and powers may be represented on a per area basis, e.g., 2500 W may also be represented as 0.884 W/cm².

The methods described herein may be used with any appropriate process temperature to obtain desired AHM characteristics, with examples ranging from about 50° C. to about 550° C. Process temperature can affect the stress, selectivity, and transparency at least in part due to $sp^2$ bond versus $sp^3$ bond formation. Higher temperatures favor $sp^2$ rich amorphous carbon network formation as the high temperatures enable easy breakage of C—H bonds and subsequent diffusion of hydrogen. For example, films deposited at temperatures above about 500° C. may have significantly more $sp^2$ CH and $CH_2$ bonds compared to $sp^3$ bonds, with increased carbon content and higher density, which correlate with increased etch selectivity. However, these films may not be suitable for thick hard mask applications due to the lower optical bandgap and of $sp^2$ carbon. For example, at 2 kÅ and above, the films may not be transparent enough for mask alignment. For example, 633 nm lasers may typically be used for transparent films and less transparent films. U.S. Pat. No. 7,981,810, referenced above, provides process conditions for deposition of selective and transparent AHM's at lower temperatures and/or dilute hydrocarbon precursor flows. AHM's deposited at lower temperatures, e.g., below about 400° C. may have more less $sp^2$ bonding compared to film deposited at higher temperatures.

Next, in operation 206, an ashable hard mask is deposited on the substrate by a PECVD process by igniting plasma using a dual RF plasma source that includes a low frequency (LF) component and a high frequency (HF) component. In some embodiments, the methods of the embodiments use LF RF power to generate high energy ion bombardment. Low frequency RF power refers to an RF power having a frequency between about 100 kHz and about 2 MHz. In some embodiments, pulsing frequency may be limited by the operation capability of the LF generator. In some embodiments, LF RF power has an RF power with a frequency of about 400 kHz, for example 430 kHz. During deposition, in some embodiments, the LF power ranges between about 0.001 W/cm² and about 0.05 W/cm², as expressed in W per cm² of substrate surface area. In some embodiments, the LF power ranges between about 0 and about 1.25 W/cm². High frequency RF power refers to an RF power having a frequency between about 2 MHz and about 60 MHz. In some embodiments, HF RF power has an RF power with a frequency of about 13.56 MHz. During deposition, in some embodiments, the HF power per substrate area ranges between about 0.001 W/cm² and about 0.05 W/cm². In some embodiments, the HF power per substrate area ranges between about 0.05 W/cm² to 1.25 W/cm².

Next, in operation 208, the LF power is pulsed while HF power is constant. In various embodiments, the LF power is pulsed by switching the LF power on and off. In certain embodiments, the LF power is pulsed between about 0 W/cm² and about 0.05 W/cm². In various embodiments, the LF power is pulsed by switching the LF between non-zero power levels. In some embodiments, the LF power is pulsed between about 0 W/cm² and about 0.02 W/cm². In many embodiments, the powers of the HFRF and LFRF are sufficient to maintain a plasma.

Duty cycle (the fraction of time during which the LF is on or at high power) for LF pulsing ranges from about 10% to about 70%. In various embodiments, the LF power is pulsed at a frequency of between about 2 Hz and about 10 Hz. In some embodiments, the LF power is pulsed at a frequency of at least about 10 Hz, or at least about 20 Hz, or at least about 100 Hz, or at least about 200 Hz.

Precursor gas flow can also be pulsed in a synchronized or non-synchronized manner with respect to LF power pulsing. Gas pulsing may be combined with RF pulsing, which may further alter the film properties to improve etch selectivity. For example, the process gas may be pulsed with a duty cycle of 50%, or with a pulse width of 0.5 seconds. According to various embodiments, the pulse frequency of the process gas is between about 0.05 Hz to about 1 Hz.

In some embodiments, HF and LF RF components can be pulsed in a synchronized manner. If an HF component is pulsed, it is pulsed from high to low power and not turned off to avoid plasma sheath collapse. Alternatively, pulsing only LF RF power may be advantageous to form more stable plasma.

Figure 3:
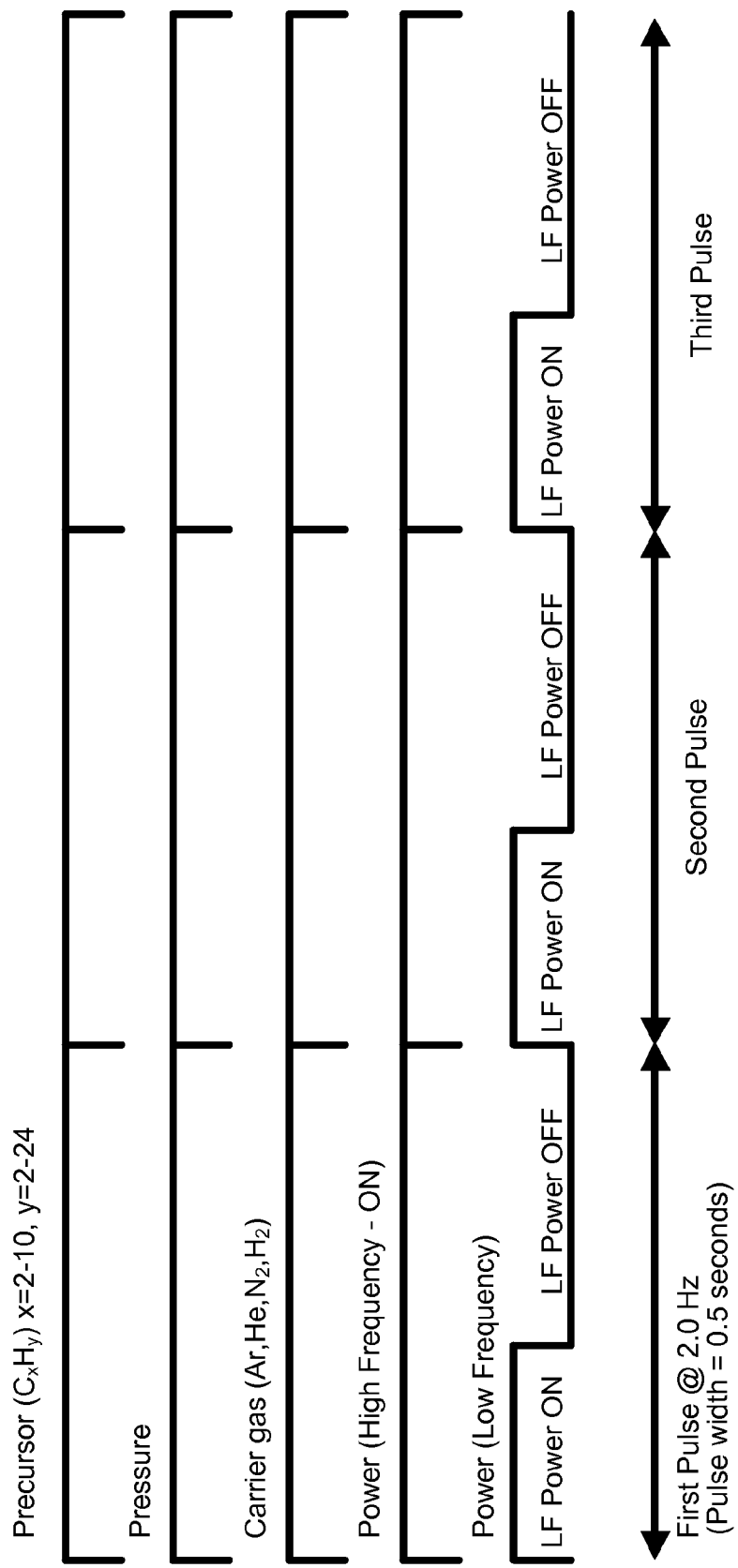
FIG. 3 shows a timing sequence diagram according to various embodiments.

FIG. 3 shows a timing sequence diagram for some embodiments where an AHM is deposited by PECVD using a dual RF plasma source with LF power pulsed at 2 Hz for a pulse width of about 0.5 seconds with LF power on for about 0.2 seconds and off for about 0.3 seconds. Three pulses are shown in FIG. 3. In other embodiments, pulse frequency may be between about 2 Hz and about 200 Hz. The process parameters of precursor gas flow, pressure, carrier gas flow, and HF power are constant.

Pulsing LF power relaxes ion and atom impinging on the layer, resulting in less stress on the layer. Such relaxation of ion and atom impinging on the layer optimizes densification of the film and reduces the hydrogen content in the layer. Thus, the stress on the layer is reduced.

According to various embodiments, the deposited AHMs have etch selectivity between about 3.6:1 and about 4.4:1 relative to the underlying layer. In some embodiments, the deposited AHMs have a hydrogen content of about 18%. In some embodiments, the deposited AHMs have a hydrogen content less than about 15%, less than about 10%, or less than about 5%.

In some embodiments, the deposited AHM has a modulus to stress ratio of 1:1. In some embodiments, the modulus of the deposited AHM is about 70 GPa and a stress is about −80 MPa.

Referring to FIG. 2, operations 206 and 208 are continued until the desired thickness of film is deposited. According to various embodiments, a film with thickness between about 1000 Å and about 90,000 Å is deposited. In some embodiments, a thin AHM layer may be deposited with a thickness between about 50 Å to about 900 Å.

Apparatus

Embodiments can be implemented in a plasma enhanced chemical vapor deposition (PECVD) reactor. Such a reactor may take many different forms. Various embodiments are compatible with existing semiconductor processing equipment—in particular, PECVD reactors such as Sequel™ or Vector™ reactor chambers available from Lam Research Corporation. The various embodiments may be implemented on a multi-station or single station tool. In specific embodiments, the 300 mm Lam Vector™ tool having a 4-station deposition scheme or the 200 mm Sequel™ tool having a 6-station deposition scheme are used.

Generally, the apparatus will include one or more chambers or reactors that each include one or more stations. Chambers will house one or more wafers and are suitable for wafer processing. The one or more chambers maintain the wafer in a defined position or positions, by preventing rotation, vibration, or other agitation. In some embodiment, a wafer undergoing AHM deposition is transferred from one station to another within a chamber during the process. For example, a 2000 Å AHM deposition may occur entirely at one station, or 500 Å of film may be deposited at each of four stations in accordance with various embodiments. Alternatively, any other fraction of the total film thickness may be deposited at any number of stations. In various embodiments where more than one AHM is deposited, more than one station may be used to deposit each AHM layer. During processing, each wafer is held in place by a pedestal, wafer chuck, and/or other wafer holding apparatus. For certain operations where the wafer is to be heated, the apparatus may include a heater such as a heating plate.

Figure 4:
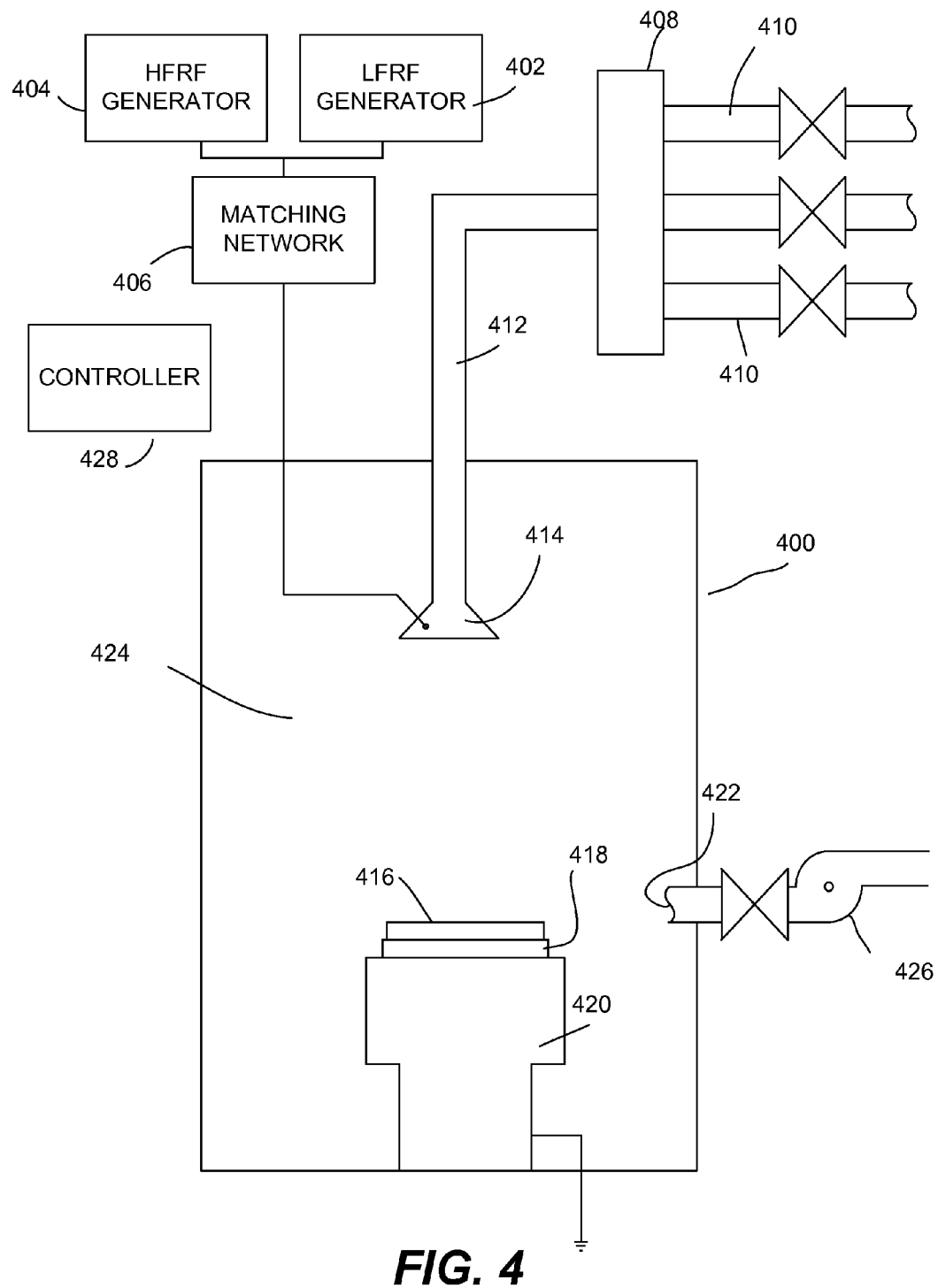
FIG. 4 shows a schematic illustration of a plasma enhanced chemical vapor deposition (PECVD) chamber suitable for practicing various embodiments.

FIG. 4 shows a schematic illustration of PECVD suitable for practicing various embodiments. As shown, a reactor 400 includes a process chamber 424, which encloses other reactor components and contains the plasma generated by a capacitor type system including a showerhead 414 working in conjunction with a grounded heater block 420. A high frequency RF generator 404 and a low-frequency RF generator 402 are connected to a matching network 406, which is further connected to showerhead 414. The power and frequency supplied by matching network 406 is sufficient to generate plasma from the process gas. A controller provides machine readable instructions for inletting precursor gas, switching the HF power on at HF RF generator 404, and switching LF power on and off or between high and low at LF RF generator 402. The controller 428 executes machine-readable system control software stored in a mass storage device, loaded into memory device, and executed on processor so that the apparatus will perform a method in accordance with the present embodiments. Alternatively, the control logic may be hard coded in the controller 428. Applications Specific Integrated Circuits, Programmable Logic Devices (e.g., field-programmable gate arrays, or FPGAs) and the like may be used for these purposes. Wherever "software" or "code" is used, functionally comparable hard coded logic may be used in its place.

Within the reactor, a wafer support 418 holds a substrate 416. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 412. Multiple source gas lines 410 are connected to manifold 408. The gases may be optionally premixed. Appropriate valving and mass flow control mechanisms are employed to ensure that the correct gases are delivered during the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 400 via an outlet 422. A vacuum pump 426 (e.g., a one or two stage mechanical dry pump and/or a turbomolecular pump) draws process gases out and maintains a suitably low pressure within the reactor by a close loop controlled flow restriction device, such as a throttle valve or a pendulum valve.

EXPERIMENTAL

The following examples are provided to further illustrate aspects of various embodiments. These examples are provided to exemplify and more clearly illustrate aspects and are not intended to be limiting. Radio frequency (RF) power levels described below are for a four-station tool configured for 300 mm wafers.

Figure 5:
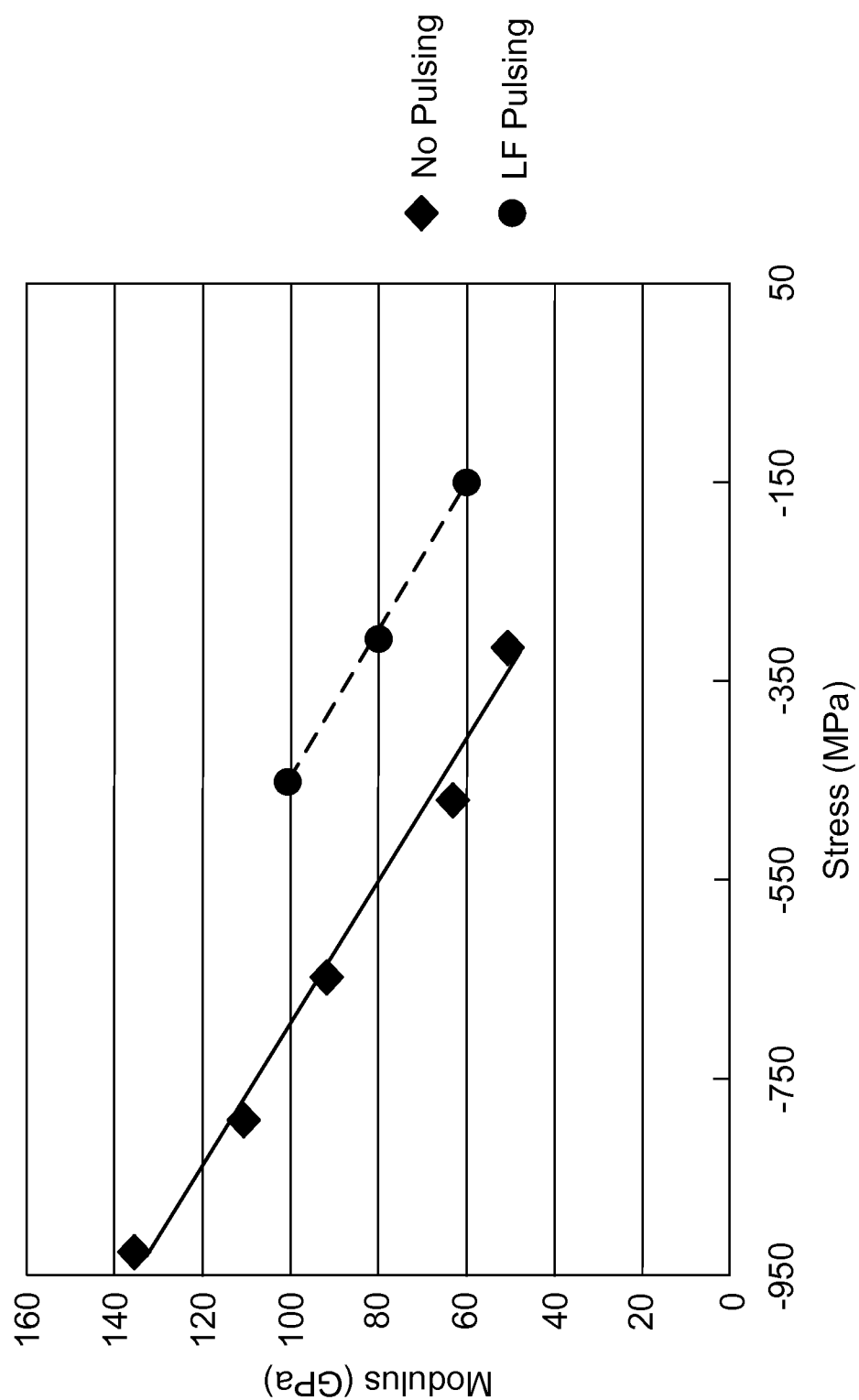
FIG. 5 is a graph showing stress and modulus results for depositing an ashable hard mask at low temperature.

Experimental data was collected for an embodiment of the process in FIG. 2. FIG. 5 shows AHM modulus in GPa of as a function of stress in MPa for AHM deposition at low temperature.

An AHM was deposited on a dielectric film on a substrate using $C_2H_2$ as a precursor and $N_2$ and He as carrier gases. Measurements were taken for the AHM modulus and stress deposited without using LF modulation. Such data is represented by the diamond-shaped points and solid line in FIG. 5. Carrier gas flow, chamber pressure, process temperature, and precursor process gas flow were kept constant. The parameters from Table 1 were used.

TABLE 1

Low Temperature No-Modulation AHM Deposition

| Parameters | | Parameter Range |
|---|---|---|
| $N_2$ | 3000 sccm | 0 to 10000 sccm |
| $C_2H_2$ | 300 sccm | 0 to 10000 sccm |
| He | 8000 sccm | 1000 to 20000 sccm |
| HF Power | 0.35 W/cm$^2$ | 0.05 to 1.25 W/cm$^2$ |
| LF Power | 0.42 W/cm$^2$ | 0 to 1.25 W/cm$^2$ |
| Pressure | 2.5 Torr | 1 to 20 Torr |

Continuous wave plasma generation was used to deposit AHM using PECVD methods. The plasma source generated HF power with a frequency of 13.56 MHz, and LF power with a frequency of 430 kHz. The HF power was 0.35 W/cm$^2$ and the LF power was 0.42 W/cm$^2$. The LF power was not pulsed; both the HF power and LF power were on and constant during the AHM deposition.

Measurements were taken for the modulus and AHM stress deposited using LF modulation. The data is represented by circle-shaped points and dotted line in FIG. 5. Carrier gas flow, chamber pressure, process temperature, and precursor process gas flow were kept constant. Parameters of Table 2 were used.

TABLE 2

Low Temperature LF-Modulation AHM Deposition

| | | Parameter Range |
|---|---|---|
| LF ON Phase | | |
| $N_2$ | 3000 sccm | 0 to 10000 sccm |
| $C_2H_2$ | 300 sccm | 0 to 10000 sccm |
| He | 8000 sccm | 1000 to 20000 sccm |
| HF Power | 0.35 W/cm$^2$ | 0.05 to 1.25 W/cm$^2$ |
| LF Power | 0.42 W/cm$^2$ | 0 to 1.25 W/cm$^2$ |
| Pressure | 2.5 Torr | 1 to 20 Torr |
| LF ON time | 90 sec | 1 to 200 sec |
| LF OFF Phase | | |
| $N_2$ | 3000 sccm | 0 to 10000 sccm |
| $C_2H_2$ | 300 sccm | 0 to 10000 sccm |
| He | 8000 sccm | 1000 to 20000 sccm |
| HF Power | 0.35 W/cm$^2$ | 0.05 to 1.25 W/cm$^2$ |
| LF Power | 0 W/cm$^2$ | 0 W/cm$^2$ or low for high/low modulation (0.02 to 0.10 W/cm$^2$) |
| Pressure | 2.5 Torr | 1 to 20 Torr |
| LF OFF time | 180 sec | 1 to 200 sec |

The dual RF plasma source generated HF power with a frequency of 13.56 MHz, and LF power with a frequency of 430 kHz. The HF power was 0.35 W/cm$^2$ and the LF power was pulsed between 0 W/cm² and 0.42 W/cm². The LF power was pulsed at a frequency of 2 Hz.

Stress and modulus data was taken for both the non-pulsed AHM and the pulsed-AHM and results are graphed in FIG. 5. Overall, for a given stress such as −450 MPa, the modulus of the LF-pulsed AHM was higher. This suggests increased rigidity of the film, and thus an increased etch selectivity. For any given modulus, the overall stress was decreased. For example, for an AHM modulus of 60 GPa, the overall stress was decreased from −450 MPa to −150 MPa, suggesting that the overall AHM is less compressed as stress approaches 0 MPa.

Figure 6:
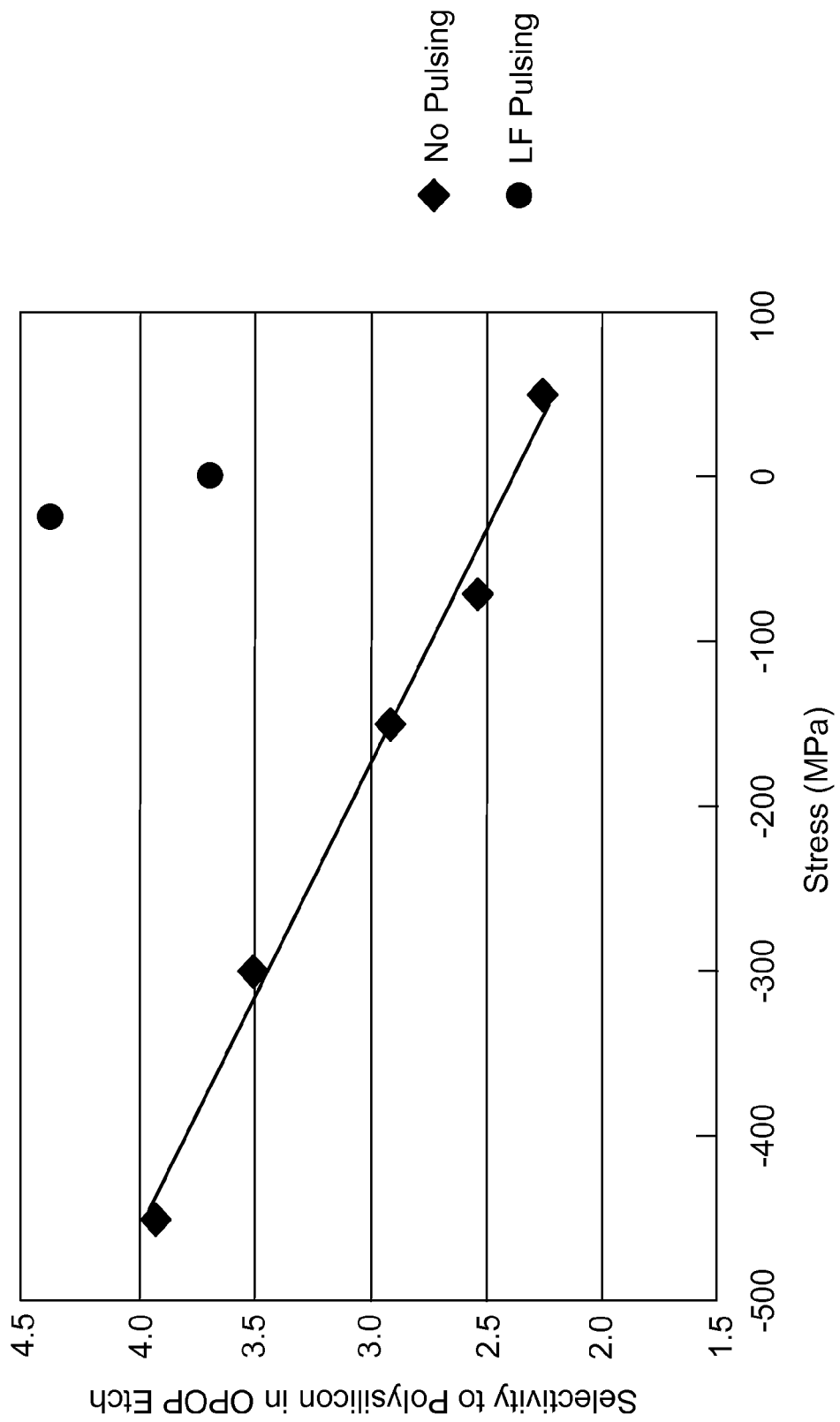
FIG. 6 is a graph showing stress and modulus results for depositing an ashable hard mask at high temperature.

Experimental data was collected for another embodiment of the process in FIG. 6. FIG. 6 shows AHM etch selectivity to polysilicon deposited in an OPOP (oxide/polysilicon stack) etch as a function of stress in MPa at high temperature.

Data for stress and selectivity was collected for AHMs deposited using continuous wave plasma generation. The data is represented by the diamond-shaped points and the solid line in FIG. 6. A polysilicon substrate layer was exposed to a precursor process gas $C_2H_2$ with carrier gases He and $N_2$ at 550° C. Carrier gas flow, chamber pressure, process temperature, and precursor process gas flow were kept constant. LF pulsing increased AHM etch selectivity by 200%. The following parameters were used:

TABLE 3

High Temperature No-Modulation AHM Deposition

| Parameters | | Parameter Range |
|---|---|---|
| $N_2$ | 1000 sccm | 0 to 10000 sccm |
| $C_2H_2$ | 900 sccm | 0 to 10000 sccm |
| He | 9000 sccm | 1000 to 20000 sccm |
| HF Power | 0.22 W/cm² | 0.05 to 1.25 W/cm² |
| LF Power | 0.22 W/cm² | 0 to 1.25 W/cm² |
| Pressure | 5 Torr | 1 to 20 Torr |

The dual RF plasma source generated HF power with a frequency of 13.56 MHz, and LF power with a frequency of 430 kHz. The HF power was 0.22 W/cm² and the LF power was 0.22 W/cm². The LF power was not pulsed; both the HF power and LF power were turned on and constant during the AHM deposition.

Next, data was collected for stress and AHM etch selectivity deposited using pulsed LF PECVD. The data is represented by the circle-shaped points in FIG. 6. A polysilicon substrate layer was exposed to a precursor process gas $C_2H_2$ at 550° C. Carrier gas flow, chamber pressure, process temperature, and precursor process gas flow were constant. The following parameters were used:

TABLE 4

High Temperature LF-Modulation AHM Deposition

| | | Parameter Range |
|---|---|---|
| LF ON Phase | | |
| $N_2$ | 1000 sccm | 0 to 10000 sccm |
| $C_2H_2$ | 900 sccm | 0 to 10000 sccm |
| He | 9000 sccm | 1000 to 20000 sccm |
| HF Power | 0.22 W/cm² | 0.05 to 1.25 W/cm² |
| LF Power | 0.22 W/cm² | 0 to 1.25 W/cm² |
| Pressure | 5 Torr | 1 to 20 Torr |
| LF ON time | 150 sec | 1 to 200 sec |
| LF OFF Phase | | |

TABLE 4-continued

High Temperature LF-Modulation AHM Deposition

| | | Parameter Range |
|---|---|---|
| $N_2$ | 1000 sccm | 0 to 10000 sccm |
| $C_2H_2$ | 900 sccm | 0 to 10000 sccm |
| He | 9000 sccm | 1000 to 20000 sccm |
| HF Power | 0.22 W/cm² | 0.05 to 1.25 W/cm² |
| LF Power | 0 W/cm² | 0 W/cm² or low (0.02 to 0.10 W/cm²) |
| Pressure | 5 Torr | 1 to 20 Torr |
| LF OFF time | 300 sec | 1 to 300 sec |

The dual RF plasma source generated HF power with a frequency of 13.56 MHz, and LF power with a frequency of 430 kHz. The HF power was 0.22 W/cm² and the LF power was pulsed between 0 W/cm² and 0.22 W/cm². The LF power was pulsed at a frequency of 2 Hz.

Etch selectivity was measured for both the continuous wave and LF-pulsed AHMs. The results are graphed in FIG. 6. Overall, at a specified level of stress, the overall selectivity of the LF-pulsed AHM film had higher selectivity to polysilicon than continuous wave plasma AHM film. This suggests that LF pulsing in the deposition process increases etch selectivity, significantly improving the AHM technology.

Figure 7:
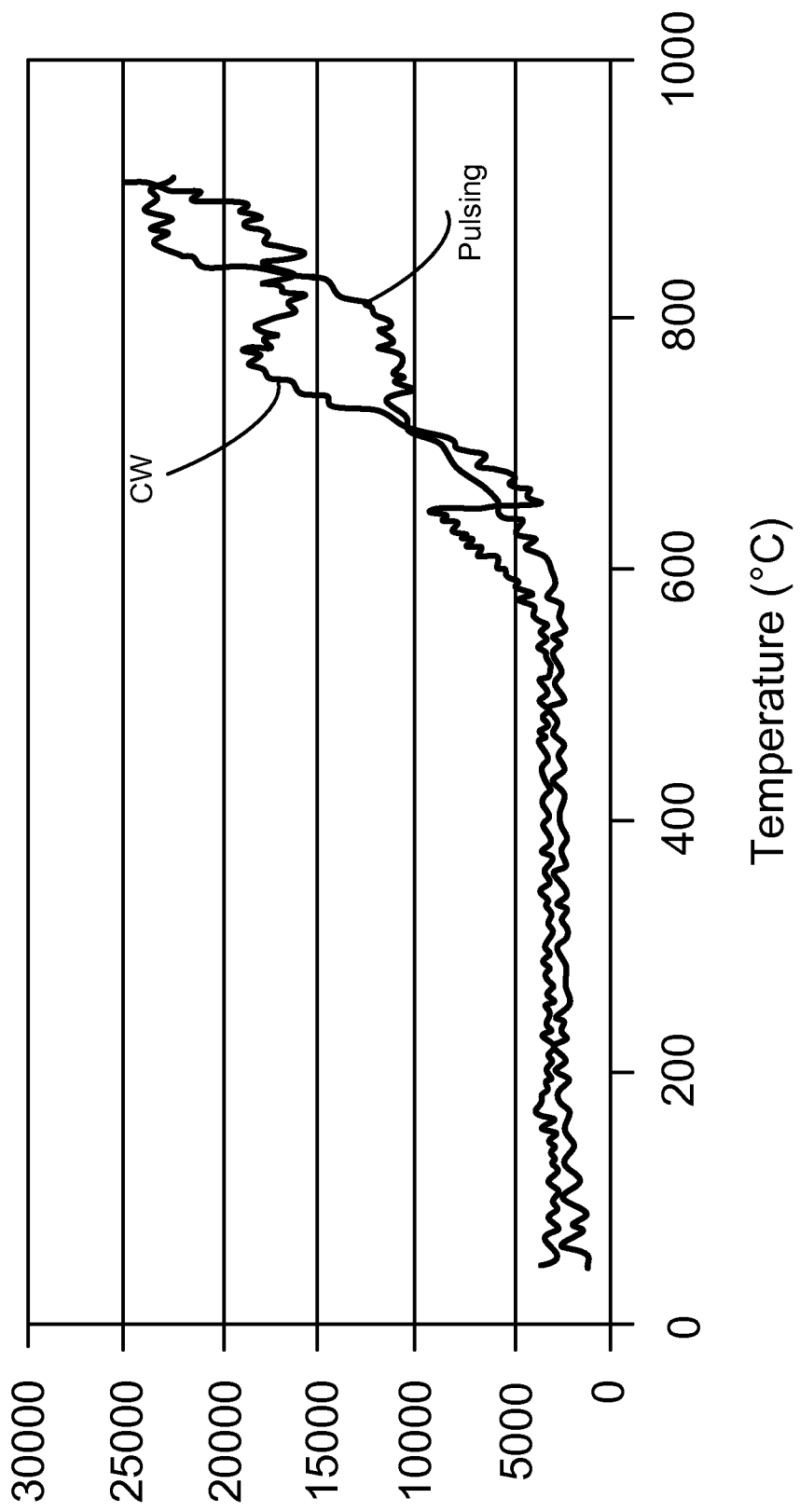
FIG. 7 is a graph showing the outgassing of hydrogen ($H_2$) measured by thermal desorption spectroscopy.

To determine the AHM's molecular composition from convention continuous wave plasma AHMs and LF-pulsed AHMs, thermal desorption spectroscopy (TDS) methods were used. FIG. 7 shows the TDS results from both AHMs deposited using continuous wave plasma and LF-pulsed plasma. At higher temperatures, the deposited AHM film had less $H_2$ outgassing than AHM deposited using continuous wave plasma, suggesting that less H content remained on the AHM. With less H content in the AHM, the AHM had a more stable molecular structure and thus higher selectivity and improved AHM performance.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method of forming an ashable hard mask, comprising:
 exposing a semiconductor substrate to a process gas comprising a hydrocarbon precursor gas to
 deposit an ashable hard mask on the substrate by a plasma enhanced chemical vapor deposition (PECVD) process;
 igniting a plasma generated by a dual radio frequency (RF) plasma source including a high frequency (HF) component and a low frequency (LF) component; and
 pulsing LF power while HF power is constant during deposition,
 wherein the hydrocarbon precursor gas has a chemical formula of $C_xH_y$, where x is an integer between 2 and 10 and y is an integer between 2 and 24.

2. The method of claim 1, wherein the LF power is pulsed between non-zero power levels.

3. The method of claim 1, wherein the LF power is pulsed by switching the LF power on and off.

4. The method of claim 1, wherein the ashable hard mask is an amorphous carbon layer.

5. The method of forming an amorphous carbon layer, comprising:
   exposing a semiconductor substrate to a process gas comprising a hydrocarbon precursor gas;
   depositing on the substrate an amorphous carbon layer by a plasms enhanced chemical vapor deposition (PECVD) process using a plasma generated by a dual radio frequency (RF) plasma source including a high frequency (HF) component and a low frequency (LF) component,
      wherein HF power is constant while LF power is pulsed during deposition, and
      wherein the hydrocarbon precursor gas has a chemical formula of $C_xH_y$, where x is an integer between 2 and 10 and y is an integer between 2 and 24.

6. The method of claim 5, wherein frequency of LF RF power is about 400 kHz.

7. The method of claim 5, wherein the LF power is pulsed at a frequency of between about 2 Hz and about 200 Hz.

8. The method of claim 7, wherein the LF power is pulsed at a frequency of between about 2 Hz and about 10 Hz.

9. The method of claim 5, wherein the depositedamorphous carbon layer has a modulus to stress ratio of 1.

10. The method of claim 5, wherein the deposited amorphous carbon layer has an etch selectivity between about 3.6 and 4.4 to an oxide, nitride or polysilicon layer.

11. A method of claim 5, wherein the deposited amorphous carbon layer has a hydrogen content of less than about 15%.

12. The method of claim 5, wherein the amorphous carbon layer is deposited at a process temperature between about 275° C. and 550° C.

13. The method of claim 5, wherein the LF power is pulsed between non-zero power levels.

14. The method of claim 5, wherein the LF power is pulsed by switching the LF power on and off.

15. The method of claim 5, wherein the bonding structure of the amorphous carbon layer includes $sp^2$, $sp^3$, and combinations thereof.

16. The method of claim 5, wherein the amorphous carbon layer is an ashable hard mask.

17. The method of claim 5, wherein the amorphous carbon layer comprises carbon, hydrogen, and a trace amount of one or more dopants selected from the group consiting of nitrogen, fluorine, boron, and silicon.

* * * * *